(12) United States Patent
Rodenbeck et al.

(10) Patent No.: US 9,315,976 B2
(45) Date of Patent: *Apr. 19, 2016

(54) CAPACITIVE COUPLING ARRANGEMENT FOR A FAUCET

(71) Applicant: DELTA FAUCET COMPANY, Indianapolis, IN (US)

(72) Inventors: Robert W. Rodenbeck, Indianapolis, IN (US); David M. Burke, Taylor, MI (US); Joel D. Sawaski, Indianapolis, IN (US)

(73) Assignee: Delta Faucet Company, Indianapolis, IN (US)

( * ) Notice: Subject to any disclaimer, the term of this patent is extended or adjusted under 35 U.S.C. 154(b) by 95 days.

This patent is subject to a terminal disclaimer.

(21) Appl. No.: 14/138,183

(22) Filed: Dec. 23, 2013

(65) Prior Publication Data

US 2014/0109984 A1    Apr. 24, 2014

Related U.S. Application Data

(63) Continuation of application No. 12/600,769, filed as application No. PCT/US2008/013598 on Dec. 11, 2008, now Pat. No. 8,613,419.

(60) Provisional application No. 61/007,165, filed on Dec. 11, 2007.

(51) Int. Cl.
*E03C 1/05*    (2006.01)
*H03K 17/96*    (2006.01)

(52) U.S. Cl.
CPC ................ *E03C 1/057* (2013.01); *E03C 1/055* (2013.01); *H03K 17/962* (2013.01);
(Continued)

(58) Field of Classification Search
CPC ... Y10T 137/9464; F16K 31/02; F16K 31/06; E03C 1/05; E03C 1/055; E03C 1/057; H03K 17/9622; H03K 2217/96073; H03K 2217/96077

See application file for complete search history.

(56) References Cited

U.S. PATENT DOCUMENTS

| 2,991,481 A | 7/1961 | Book |
| 3,081,594 A | 3/1963 | Atkins et al. |

(Continued)

FOREIGN PATENT DOCUMENTS

| CA | 2492226 A1 | 7/2005 |
| DE | 3339849 | 5/1985 |

(Continued)

OTHER PUBLICATIONS

Camacho et al., Freescale Semiconductor, "Touch Pad System Using MC34940/MC33794 E-Field Sensors," Feb. 2006, 52 pgs.

(Continued)

*Primary Examiner* — Matthew W Jellett
(74) *Attorney, Agent, or Firm* — Faegre Baker Daniels LLP

(57) ABSTRACT

A faucet includes a spout and a manual handle that controls a manual valve located in a passageway that conducts fluid flow through the spout. An electrically operable valve is also located within the passageway. The faucet also includes an insulator located between the spout and the manual handle so that the spout is electrically isolated from the manual handle, a first touch sensor on the manual valve handle, a second touch sensor on the spout, and a capacitive sensor directly coupled to one of the first and second touch sensors and capacitively coupled to the other of the first and second touch sensors. The faucet further includes a controller coupled to the capacitive sensor. The controller monitors an output signal from the capacitive sensor to detect touching of the spout and the manual valve handle. The controller is also coupled to the electrically operable valve to control the electrically operable valve in response to the output signal from the capacitive sensor.

21 Claims, 5 Drawing Sheets

(52) U.S. Cl.
CPC ............... *H03K 2217/94052* (2013.01); *H03K 2217/94089* (2013.01); *Y10T 137/0318* (2015.04); *Y10T 137/1842* (2015.04); *Y10T 137/9464* (2015.04)

(56) References Cited

U.S. PATENT DOCUMENTS

| | | |
|---|---|---|
| 3,151,340 A | 10/1964 | Teshima |
| 3,254,313 A | 5/1966 | Atkins et al. |
| 3,314,081 A | 4/1967 | Atkins et al. |
| 3,333,160 A | 7/1967 | Gorski |
| 3,406,941 A | 10/1968 | Ichimori et al. |
| 3,588,038 A | 6/1971 | Tanaka |
| 3,651,989 A | 3/1972 | Westrich |
| 3,685,541 A | 8/1972 | Braucksick et al. |
| 3,705,574 A | 12/1972 | Duncan |
| 3,765,455 A | 10/1973 | Countryman |
| 3,799,171 A | 3/1974 | Patel |
| 3,987,819 A | 10/1976 | Scheuermann |
| 4,185,336 A | 1/1980 | Young |
| 4,201,518 A | 5/1980 | Stevenson |
| 4,219,740 A | 8/1980 | Little |
| 4,290,052 A | 9/1981 | Eichelberger et al. |
| 4,295,132 A | 10/1981 | Burney et al. |
| 4,331,292 A | 5/1982 | Zimmer |
| 4,337,388 A | 6/1982 | July |
| 4,359,186 A | 11/1982 | Kiendl |
| 4,406,313 A | 9/1983 | Bennett et al. |
| 4,407,444 A | 10/1983 | Knebel et al. |
| 4,409,694 A | 10/1983 | Barrett et al. |
| 4,410,791 A | 10/1983 | Eastep |
| 4,420,811 A | 12/1983 | Tarnay et al. |
| 4,421,269 A | 12/1983 | Ts'ao |
| 4,424,767 A | 1/1984 | Wicke et al. |
| 4,429,422 A | 2/1984 | Wareham |
| 4,436,983 A | 3/1984 | Solobay |
| 4,439,669 A | 3/1984 | Ryffel |
| 4,450,829 A | 5/1984 | Morita et al. |
| 4,459,465 A | 7/1984 | Knight |
| 4,503,575 A | 3/1985 | Knoop et al. |
| 4,537,348 A | 8/1985 | Gossi |
| 4,541,562 A | 9/1985 | Zukausky |
| 4,554,688 A | 11/1985 | Puccerella |
| 4,563,780 A | 1/1986 | Pollack |
| 4,567,350 A | 1/1986 | Todd, Jr. |
| 4,581,707 A | 4/1986 | Millar |
| 4,584,463 A | 4/1986 | Klages et al. |
| 4,604,515 A | 8/1986 | Davidson |
| 4,606,325 A | 8/1986 | Lujan |
| 4,611,757 A | 9/1986 | Saether |
| 4,628,902 A | 12/1986 | Comber |
| 4,638,147 A | 1/1987 | Dytch et al. |
| 4,674,678 A | 6/1987 | Knebel et al. |
| 4,680,446 A | 7/1987 | Post |
| 4,682,581 A | 7/1987 | Laing et al. |
| 4,682,728 A | 7/1987 | Oudenhoven et al. |
| 4,688,277 A | 8/1987 | Kakinoki et al. |
| 4,700,884 A | 10/1987 | Barrett et al. |
| 4,700,885 A | 10/1987 | Knebel |
| 4,709,728 A | 12/1987 | Ying-Chung |
| 4,713,525 A | 12/1987 | Eastep |
| 4,716,605 A | 1/1988 | Shepherd et al. |
| 4,735,357 A | 4/1988 | Gregory et al. |
| 4,738,280 A | 4/1988 | Oberholtzer |
| 4,742,456 A | 5/1988 | Kamena |
| 4,750,472 A | 6/1988 | Fazekas |
| 4,753,265 A | 6/1988 | Barrett et al. |
| 4,756,030 A | 7/1988 | Juliver |
| 4,757,943 A | 7/1988 | Sperling et al. |
| 4,761,839 A | 8/1988 | Ganaway |
| 4,762,273 A | 8/1988 | Gregory et al. |
| 4,768,705 A | 9/1988 | Tsutsui et al. |
| 4,786,782 A | 11/1988 | Takai et al. |
| 4,798,224 A | 1/1989 | Haws |
| 4,808,793 A | 2/1989 | Hurko |
| 4,832,259 A | 5/1989 | Vandermeyden |
| 4,845,316 A | 7/1989 | Kaercher |
| 4,854,498 A | 8/1989 | Stayton |
| 4,869,287 A | 9/1989 | Pepper et al. |
| 4,869,427 A | 9/1989 | Kawamoto et al. |
| 4,870,986 A | 10/1989 | Barrett et al. |
| 4,872,485 A | 10/1989 | Laverty |
| 4,875,623 A | 10/1989 | Garris |
| 4,893,653 A | 1/1990 | Ferrigno |
| 4,896,658 A | 1/1990 | Yonekubo et al. |
| 4,901,915 A | 2/1990 | Sakakibara |
| 4,909,435 A | 3/1990 | Kidouchi et al. |
| 4,914,758 A | 4/1990 | Shaw |
| 4,916,613 A | 4/1990 | Lange et al. |
| 4,917,142 A | 4/1990 | Laing et al. |
| 4,921,211 A | 5/1990 | Novak et al. |
| 4,923,116 A | 5/1990 | Homan |
| 4,930,551 A | 6/1990 | Haws |
| 4,936,289 A | 6/1990 | Peterson |
| 4,941,608 A | 7/1990 | Shimizu et al. |
| 4,945,942 A | 8/1990 | Lund |
| 4,945,943 A | 8/1990 | Cogger |
| 4,955,535 A | 9/1990 | Tsutsui et al. |
| 4,965,894 A | 10/1990 | Baus |
| 4,967,794 A | 11/1990 | Tsutsui et al. |
| 4,969,598 A | 11/1990 | Garris |
| 4,970,373 A | 11/1990 | Lutz et al. |
| 4,971,106 A | 11/1990 | Tsutsui et al. |
| 4,981,158 A | 1/1991 | Brondolino et al. |
| 4,985,944 A | 1/1991 | Shaw |
| 4,995,585 A | 2/1991 | Gruber et al. |
| 4,998,673 A | 3/1991 | Pilolla |
| 5,009,572 A | 4/1991 | Imhoff et al. |
| 5,012,124 A | 4/1991 | Hollaway |
| 5,020,127 A | 5/1991 | Eddas et al. |
| 5,033,508 A | 7/1991 | Laverty |
| 5,033,715 A | 7/1991 | Chiang |
| 5,040,106 A | 8/1991 | Maag |
| 5,042,524 A | 8/1991 | Lund |
| 5,056,712 A | 10/1991 | Enck |
| 5,057,214 A | 10/1991 | Morris |
| 5,058,804 A | 10/1991 | Yonekubo et al. |
| 5,063,955 A | 11/1991 | Sakakibara |
| 5,073,991 A | 12/1991 | Marty |
| 5,074,520 A | 12/1991 | Lee et al. |
| 5,086,526 A | 2/1992 | Van Marcke |
| 5,092,560 A | 3/1992 | Chen |
| 5,095,945 A | 3/1992 | Jensen |
| 5,105,846 A | 4/1992 | Britt |
| 5,124,934 A | 6/1992 | Kawamoto et al. |
| 5,125,433 A | 6/1992 | DeMoss et al. |
| 5,129,034 A | 7/1992 | Sydenstricker |
| 5,133,089 A | 7/1992 | Tsutsui et al. |
| 5,139,044 A | 8/1992 | Otten et al. |
| 5,143,049 A | 9/1992 | Laing et al. |
| 5,148,824 A | 9/1992 | Wilson et al. |
| 5,170,361 A | 12/1992 | Reed |
| 5,170,514 A | 12/1992 | Weigert |
| 5,170,816 A | 12/1992 | Schnieders |
| 5,170,944 A | 12/1992 | Shirai |
| 5,174,495 A | 12/1992 | Eichholz et al. |
| 5,175,892 A | 1/1993 | Shaw |
| 5,183,029 A | 2/1993 | Ranger |
| 5,184,642 A | 2/1993 | Powell |
| 5,187,816 A | 2/1993 | Chiou |
| 5,202,666 A | 4/1993 | Knippscheer |
| 5,205,318 A | 4/1993 | Massaro et al. |
| 5,206,963 A | 5/1993 | Wiens |
| 5,217,035 A | 6/1993 | Van Marcke |
| 5,224,509 A | 7/1993 | Tanaka et al. |
| 5,224,685 A | 7/1993 | Chiang et al. |
| 5,243,717 A | 9/1993 | Yasuo |
| D340,279 S | 10/1993 | Mattis |
| 5,257,341 A | 10/1993 | Austin et al. |
| 5,261,443 A | 11/1993 | Walsh |
| 5,262,621 A | 11/1993 | Hu et al. |
| 5,265,318 A | 11/1993 | Shero |
| 5,277,219 A | 1/1994 | Lund |
| 5,281,808 A | 1/1994 | Kunkel |

(56) References Cited

U.S. PATENT DOCUMENTS

| | | |
|---|---|---|
| 5,287,570 A | 2/1994 | Peterson et al. |
| 5,309,940 A | 5/1994 | Delabie et al. |
| 5,315,719 A | 5/1994 | Tsutsui et al. |
| 5,322,086 A | 6/1994 | Sullivan |
| 5,323,803 A | 6/1994 | Blumenauer |
| 5,325,822 A | 7/1994 | Fernandez |
| 5,334,819 A | 8/1994 | Lin |
| 5,341,839 A | 8/1994 | Kobayashi et al. |
| 5,351,347 A | 10/1994 | Kunkel |
| 5,351,712 A | 10/1994 | Houlihan |
| 5,358,177 A | 10/1994 | Cashmore |
| 5,361,215 A | 11/1994 | Tompkins et al. |
| 5,362,026 A | 11/1994 | Kobayashi et al. |
| 5,385,168 A | 1/1995 | Lund |
| 5,397,099 A | 3/1995 | Pilolla |
| 5,400,961 A | 3/1995 | Tsutsui et al. |
| 5,408,578 A | 4/1995 | Bolivar |
| 5,419,930 A | 5/1995 | Schucker |
| 5,429,272 A | 7/1995 | Luigi |
| 5,437,003 A | 7/1995 | Blanco |
| RE35,018 E | 8/1995 | Homan |
| 5,438,642 A | 8/1995 | Posen |
| 5,467,967 A | 11/1995 | Gillooly |
| 5,479,558 A | 12/1995 | White et al. |
| 5,482,250 A | 1/1996 | Kodaira |
| 5,504,306 A | 4/1996 | Russell et al. |
| 5,504,950 A | 4/1996 | Natalizia et al. |
| 5,511,579 A | 4/1996 | Price |
| 5,511,723 A | 4/1996 | Eki et al. |
| 5,540,555 A | 7/1996 | Corso et al. |
| 5,549,273 A | 8/1996 | Aharon |
| 5,550,753 A | 8/1996 | Tompkins et al. |
| 5,551,637 A | 9/1996 | Lo |
| 5,555,912 A | 9/1996 | Saadi et al. |
| 5,564,462 A | 10/1996 | Storch |
| 5,566,702 A | 10/1996 | Philipp |
| 5,570,869 A | 11/1996 | Diaz et al. |
| 5,572,985 A | 11/1996 | Benham |
| 5,577,660 A | 11/1996 | Hansen |
| 5,584,316 A | 12/1996 | Lund |
| 5,586,572 A | 12/1996 | Lund |
| 5,588,636 A | 12/1996 | Eichholz et al. |
| 5,595,216 A | 1/1997 | Pilolla |
| 5,595,342 A | 1/1997 | McNair et al. |
| 5,603,344 A | 2/1997 | Hall |
| 5,609,370 A | 3/1997 | Szabo et al. |
| 5,610,589 A | 3/1997 | Evans et al. |
| 5,622,203 A | 4/1997 | Givler et al. |
| 5,623,990 A | 4/1997 | Pirkle |
| 5,627,375 A | 5/1997 | Hsieh |
| 5,650,597 A | 7/1997 | Redmayne |
| 5,651,384 A | 7/1997 | Rudrich |
| 5,655,749 A | 8/1997 | Mauerhofer |
| 5,682,032 A | 10/1997 | Philipp |
| 5,694,653 A | 12/1997 | Harald |
| 5,729,422 A | 3/1998 | Henke |
| 5,730,165 A | 3/1998 | Philipp |
| 5,735,291 A | 4/1998 | Kaonohi |
| 5,743,511 A | 4/1998 | Eichholz et al. |
| 5,755,262 A | 5/1998 | Pilolla |
| 5,758,688 A | 6/1998 | Hamanaka et al. |
| 5,758,690 A | 6/1998 | Humpert et al. |
| 5,769,120 A | 6/1998 | Laverty et al. |
| 5,771,501 A | 6/1998 | Shaw |
| 5,775,372 A | 7/1998 | Houlihan |
| 5,784,531 A | 7/1998 | Mann et al. |
| 5,790,024 A | 8/1998 | Ripingill et al. |
| 5,812,059 A | 9/1998 | Shaw et al. |
| 5,813,655 A | 9/1998 | Pinchott et al. |
| 5,819,366 A | 10/1998 | Edin |
| 5,829,467 A | 11/1998 | Spicher |
| 5,829,475 A | 11/1998 | Acker |
| 5,845,844 A | 12/1998 | Zosimodis |
| 5,855,356 A | 1/1999 | Fait |
| 5,857,717 A | 1/1999 | Caffrey |
| 5,868,311 A | 2/1999 | Cretu-Petra |
| 5,872,891 A | 2/1999 | Son |
| 5,893,387 A | 4/1999 | Paterson et al. |
| 5,915,417 A | 6/1999 | Diaz et al. |
| 5,918,855 A | 7/1999 | Hamanaka et al. |
| 5,934,325 A | 8/1999 | Brattoli et al. |
| 5,941,275 A | 8/1999 | Laing |
| 5,941,504 A | 8/1999 | Toma et al. |
| 5,943,713 A | 8/1999 | Paterson et al. |
| 5,944,221 A | 8/1999 | Laing et al. |
| 5,961,095 A | 10/1999 | Schrott |
| 5,963,624 A | 10/1999 | Pope |
| 5,966,753 A | 10/1999 | Gauthier et al. |
| 5,973,417 A | 10/1999 | Goetz et al. |
| 5,979,776 A | 11/1999 | Williams |
| 5,983,922 A | 11/1999 | Laing et al. |
| 5,988,593 A | 11/1999 | Rice |
| 6,000,170 A | 12/1999 | Davis |
| 6,003,170 A | 12/1999 | Humpert et al. |
| 6,003,182 A | 12/1999 | Song |
| 6,006,784 A | 12/1999 | Tsutsui et al. |
| 6,019,130 A | 2/2000 | Rump |
| 6,026,844 A | 2/2000 | Laing et al. |
| 6,029,094 A | 2/2000 | Diffut |
| 6,032,616 A | 3/2000 | Jones |
| 6,042,885 A | 3/2000 | Woollard et al. |
| 6,059,192 A | 5/2000 | Zosimadis |
| 6,061,499 A | 5/2000 | Hlebovy |
| 6,075,454 A | 6/2000 | Yamasaki |
| 6,082,407 A | 7/2000 | Paterson et al. |
| 6,101,452 A | 8/2000 | Krall et al. |
| 6,125,482 A | 10/2000 | Foster |
| 6,132,085 A | 10/2000 | Bergeron |
| 6,167,845 B1 | 1/2001 | Decker, Sr. |
| 6,175,689 B1 | 1/2001 | Blanco, Jr. |
| 6,182,683 B1 | 2/2001 | Sisk |
| 6,192,192 B1 | 2/2001 | Illy et al. |
| 6,195,588 B1 | 2/2001 | Gauthier et al. |
| 6,202,980 B1 | 3/2001 | Vincent et al. |
| 6,220,297 B1 | 4/2001 | Marty et al. |
| 6,227,235 B1 | 5/2001 | Laing et al. |
| 6,240,250 B1 | 5/2001 | Blanco, Jr. |
| 6,250,558 B1 | 6/2001 | Dogre Cuevas |
| 6,250,601 B1 | 6/2001 | Kolar et al. |
| 6,273,394 B1 | 8/2001 | Vincent et al. |
| 6,283,139 B1 | 9/2001 | Symonds et al. |
| 6,286,764 B1 | 9/2001 | Garvey et al. |
| 6,288,707 B1 | 9/2001 | Philipp |
| 6,290,139 B1 | 9/2001 | Kolze |
| 6,294,786 B1 | 9/2001 | Marcichow et al. |
| 6,315,208 B1 | 11/2001 | Doyle |
| 6,317,717 B1 | 11/2001 | Lindsey et al. |
| 6,321,785 B1 | 11/2001 | Bergmann |
| 6,337,635 B1 | 1/2002 | Ericksen et al. |
| 6,340,032 B1 | 1/2002 | Zosimadis |
| 6,341,389 B2 | 1/2002 | Philipps-Liebich et al. |
| 6,351,603 B2 | 2/2002 | Waithe et al. |
| 6,363,549 B2 | 4/2002 | Humpert |
| 6,373,265 B1 | 4/2002 | Morimoto et al. |
| 6,377,009 B1 | 4/2002 | Philipp |
| 6,381,770 B1 | 5/2002 | Raisch |
| 6,389,226 B1 | 5/2002 | Neale et al. |
| 6,438,770 B1 | 8/2002 | Hed et al. |
| 6,445,306 B1 | 9/2002 | Trovato et al. |
| 6,446,875 B1 | 9/2002 | Brooks et al. |
| 6,452,514 B1 | 9/2002 | Philipp |
| RE37,888 E | 10/2002 | Cretu-Petra |
| 6,457,355 B1 | 10/2002 | Philipp |
| 6,466,036 B1 | 10/2002 | Philipp |
| 6,473,917 B1 | 11/2002 | Mateina |
| 6,474,951 B2 | 11/2002 | Stephan et al. |
| 6,513,787 B1 | 2/2003 | Jeromson et al. |
| 6,522,078 B1 | 2/2003 | Okamoto et al. |
| 6,535,134 B2 | 3/2003 | Lang et al. |
| 6,535,200 B2 | 3/2003 | Philipp |
| 6,536,464 B1 | 3/2003 | Lum et al. |
| 6,549,816 B2 | 4/2003 | Gauthier et al. |
| 6,574,426 B1 | 6/2003 | Blanco, Jr. |
| 6,588,377 B1 | 7/2003 | Leary et al. |

(56) References Cited

U.S. PATENT DOCUMENTS

| | | |
|---|---|---|
| 6,588,453 B2 | 7/2003 | Marty et al. |
| 6,612,267 B1 | 9/2003 | West |
| 6,619,320 B2 | 9/2003 | Parsons |
| 6,622,930 B2 | 9/2003 | Laing et al. |
| 6,629,645 B2 | 10/2003 | Mountford et al. |
| 6,639,209 B1 | 10/2003 | Patterson et al. |
| 6,644,333 B2 | 11/2003 | Gloodt |
| 6,659,048 B1 | 12/2003 | DeSantis et al. |
| 6,676,024 B1 | 1/2004 | McNerney et al. |
| 6,684,822 B1 | 2/2004 | Lieggi |
| 6,691,338 B2 | 2/2004 | Zieger |
| 6,705,534 B1 | 3/2004 | Mueller |
| 6,707,030 B1 | 3/2004 | Watson |
| 6,734,685 B2 | 5/2004 | Rudrich |
| 6,738,996 B1 | 5/2004 | Malek et al. |
| 6,757,921 B2 | 7/2004 | Esche |
| 6,768,103 B2 | 7/2004 | Watson |
| 6,770,869 B2 | 8/2004 | Patterson et al. |
| 6,779,552 B1 | 8/2004 | Coffman |
| 6,838,887 B2 | 1/2005 | Denen et al. |
| 6,845,526 B2 | 1/2005 | Malek et al. |
| 6,877,172 B2 | 4/2005 | Malek et al. |
| 6,892,952 B2 | 5/2005 | Chang et al. |
| 6,895,985 B2 | 5/2005 | Popper et al. |
| 6,913,203 B2 | 7/2005 | DeLangis |
| 6,955,333 B2 | 10/2005 | Patterson et al. |
| 6,956,498 B1 | 10/2005 | Gauthier et al. |
| 6,962,162 B2 | 11/2005 | Acker |
| 6,962,168 B2 | 11/2005 | McDaniel et al. |
| 6,964,404 B2 | 11/2005 | Patterson et al. |
| 6,964,405 B2 | 11/2005 | Marcichow et al. |
| 6,968,860 B1 | 11/2005 | Haenlein et al. |
| 6,993,607 B2 | 1/2006 | Philipp |
| 6,995,670 B2 | 2/2006 | Wadlow et al. |
| 6,998,545 B2 | 2/2006 | Harkcom et al. |
| 7,006,078 B2 | 2/2006 | Kim |
| 7,014,166 B1 | 3/2006 | Wang |
| 7,015,704 B1 | 3/2006 | Lang |
| 7,025,077 B2 | 4/2006 | Vogel |
| 7,030,860 B1 | 4/2006 | Hsu et al. |
| 7,069,357 B2 | 6/2006 | Marx et al. |
| 7,069,941 B2 | 7/2006 | Parsons et al. |
| 7,083,156 B2 | 8/2006 | Jost et al. |
| 7,096,517 B2 | 8/2006 | Gubeli et al. |
| 7,099,649 B2 | 8/2006 | Patterson et al. |
| D528,991 S | 9/2006 | Katsuyama |
| 7,102,366 B2 | 9/2006 | Denen et al. |
| 7,107,631 B2 | 9/2006 | Lang et al. |
| 7,150,293 B2 | 12/2006 | Jonte |
| 7,174,577 B2 | 2/2007 | Jost et al. |
| 7,174,579 B1 | 2/2007 | Bauza |
| 7,232,111 B2 | 6/2007 | McDaniel et al. |
| 7,278,624 B2 | 10/2007 | Iott et al. |
| 7,307,485 B1 | 12/2007 | Snyder et al. |
| 7,537,023 B2 | 5/2009 | Marty et al. |
| 7,537,195 B2 | 5/2009 | McDaniel et al. |
| 7,690,395 B2 | 4/2010 | Jonte et al. |
| 7,766,026 B2 | 8/2010 | Boey |
| 7,784,481 B2 | 8/2010 | Kunkel |
| 8,040,142 B1 | 10/2011 | Bokma et al. |
| 8,613,419 B2 * | 12/2013 | Rodenbeck et al. ..... 251/129.04 |
| 2001/0011389 A1 | 8/2001 | Philipps-Liebich et al. |
| 2001/0011390 A1 | 8/2001 | Humpert et al. |
| 2001/0011558 A1 | 8/2001 | Schumacher |
| 2001/0011560 A1 | 8/2001 | Pawelzik et al. |
| 2001/0022352 A1 | 9/2001 | Rudrich |
| 2002/0007510 A1 | 1/2002 | Mann |
| 2002/0015024 A1 | 2/2002 | Westerman et al. |
| 2002/0113134 A1 | 8/2002 | Laing et al. |
| 2002/0117122 A1 | 8/2002 | Lindner |
| 2002/0148040 A1 | 10/2002 | Mateina |
| 2002/0175789 A1 | 11/2002 | Pimouguet |
| 2002/0179723 A1 | 12/2002 | Wack et al. |
| 2003/0041374 A1 | 3/2003 | Franke |
| 2003/0080194 A1 | 5/2003 | O'Hara et al. |
| 2003/0088338 A1 | 5/2003 | Phillips et al. |
| 2003/0089399 A1 | 5/2003 | Acker |
| 2003/0125842 A1 | 7/2003 | Chang et al. |
| 2003/0126993 A1 | 7/2003 | Lassota et al. |
| 2003/0185548 A1 | 10/2003 | Novotny et al. |
| 2003/0201018 A1 | 10/2003 | Bush |
| 2003/0213062 A1 | 11/2003 | Honda et al. |
| 2003/0234769 A1 | 12/2003 | Cross et al. |
| 2004/0011399 A1 | 1/2004 | Segien, Jr. |
| 2004/0041033 A1 | 3/2004 | Kemp |
| 2004/0041034 A1 | 3/2004 | Kemp |
| 2004/0041110 A1 | 3/2004 | Kaneko |
| 2004/0061685 A1 | 4/2004 | Ostergard et al. |
| 2004/0088786 A1 | 5/2004 | Malek et al. |
| 2004/0135010 A1 | 7/2004 | Malek et al. |
| 2004/0143898 A1 | 7/2004 | Jost et al. |
| 2004/0144866 A1 | 7/2004 | Nelson et al. |
| 2004/0149643 A1 | 8/2004 | Vandenbelt et al. |
| 2004/0155116 A1 | 8/2004 | Wack et al. |
| 2004/0206405 A1 | 10/2004 | Smith et al. |
| 2004/0212599 A1 | 10/2004 | Cok et al. |
| 2004/0262552 A1 | 12/2004 | Lowe |
| 2005/0001046 A1 | 1/2005 | Laing |
| 2005/0006402 A1 | 1/2005 | Acker |
| 2005/0022871 A1 | 2/2005 | Acker |
| 2005/0044625 A1 | 3/2005 | Kommers |
| 2005/0086958 A1 | 4/2005 | Walsh |
| 2005/0117912 A1 | 6/2005 | Patterson et al. |
| 2005/0121529 A1 | 6/2005 | DeLangis |
| 2005/0125083 A1 | 6/2005 | Kiko |
| 2005/0127313 A1 | 6/2005 | Watson |
| 2005/0146513 A1 | 7/2005 | Hill et al. |
| 2005/0150552 A1 | 7/2005 | Forshey |
| 2005/0150556 A1 | 7/2005 | Jonte |
| 2005/0150557 A1 | 7/2005 | McDaniel et al. |
| 2005/0151101 A1 | 7/2005 | McDaniel et al. |
| 2005/0194399 A1 | 9/2005 | Proctor |
| 2005/0199841 A1 | 9/2005 | O'Maley et al. |
| 2005/0199843 A1 | 9/2005 | Jost et al. |
| 2005/0205818 A1 | 9/2005 | Bayley et al. |
| 2005/0253102 A1 | 11/2005 | Boilen et al. |
| 2005/0273218 A1 | 12/2005 | Breed et al. |
| 2006/0066991 A1 | 3/2006 | Hirano et al. |
| 2006/0101575 A1 | 5/2006 | Louis |
| 2006/0130907 A1 | 6/2006 | Marty et al. |
| 2006/0130908 A1 | 6/2006 | Marty et al. |
| 2006/0138246 A1 | 6/2006 | Stowe et al. |
| 2006/0145111 A1 | 7/2006 | Lang et al. |
| 2006/0153165 A1 | 7/2006 | Beachy |
| 2006/0186215 A1 | 8/2006 | Logan |
| 2006/0200903 A1 | 9/2006 | Rodenbeck et al. |
| 2006/0201558 A1 | 9/2006 | Marty et al. |
| 2006/0202142 A1 | 9/2006 | Marty et al. |
| 2006/0207019 A1 | 9/2006 | Vincent |
| 2006/0212016 A1 | 9/2006 | Lavon et al. |
| 2006/0214016 A1 | 9/2006 | Erdely et al. |
| 2006/0231638 A1 | 10/2006 | Belz et al. |
| 2006/0231782 A1 | 10/2006 | Iott et al. |
| 2006/0231788 A1 | 10/2006 | Cheng |
| 2006/0237674 A1 | 10/2006 | Iott et al. |
| 2006/0283511 A1 | 12/2006 | Nelson |
| 2007/0001018 A1 | 1/2007 | Schmitt et al. |
| 2007/0057215 A1 | 3/2007 | Parsons et al. |
| 2007/0069168 A1 | 3/2007 | Jonte |
| 2007/0069169 A1 | 3/2007 | Lin |
| 2007/0114073 A1 | 5/2007 | Akel et al. |
| 2007/0138421 A1 | 6/2007 | Gibson et al. |
| 2007/0156260 A1 | 7/2007 | Rodenbeck et al. |
| 2007/0157978 A1 | 7/2007 | Jonte |
| 2007/0187635 A1 | 8/2007 | Jost |
| 2007/0246267 A1 | 10/2007 | Koottungal |
| 2007/0246550 A1 | 10/2007 | Rodenbeck et al. |
| 2007/0246564 A1 | 10/2007 | Rodenbeck et al. |
| 2008/0078019 A1 | 4/2008 | Allen et al. |
| 2008/0099088 A1 | 5/2008 | Boey |
| 2008/0109956 A1 | 5/2008 | Bayley et al. |
| 2008/0178950 A1 | 7/2008 | Marty et al. |
| 2008/0271238 A1 | 11/2008 | Reeder et al. |
| 2008/0289098 A1 | 11/2008 | Kunkel |

(56) References Cited

U.S. PATENT DOCUMENTS

| | | | |
|---|---|---|---|
| 2009/0039176 A1 | 2/2009 | Davidson et al. |
| 2009/0119832 A1 | 5/2009 | Conroy |
| 2009/0160659 A1 | 6/2009 | Bailey |
| 2009/0293192 A1 | 12/2009 | Pons |
| 2010/0012194 A1 | 1/2010 | Jonte et al. |
| 2010/0044604 A1 | 2/2010 | Burke et al. |
| 2010/0096017 A1 | 4/2010 | Jonte et al. |

FOREIGN PATENT DOCUMENTS

| | | |
|---|---|---|
| DE | 04401637 | 5/1998 |
| DE | 19815324 | 11/2000 |
| EP | 0961067 B1 | 12/1999 |
| EP | 1 134 895 | 9/2001 |
| JP | 63111383 | 5/1998 |
| JP | 200073426 | 3/2000 |
| JP | 2003-20703 A | 1/2003 |
| JP | 2003105817 | 4/2003 |
| JP | 2003105827 | 4/2003 |
| JP | 2003293411 | 10/2003 |
| JP | 2004-92023 | 3/2004 |
| JP | 2005-146551 A | 6/2005 |
| KR | 10-1997-0700266 | 1/1997 |
| KR | 2003-0077823 | 10/2003 |
| KR | 20-0382786 Y1 | 4/2005 |
| WO | WO 91/17377 | 11/1991 |
| WO | WO 96 14477 | 5/1996 |
| WO | WO 01/20204 | 3/2001 |
| WO | WO2004/094990 | 11/2004 |
| WO | WO 2005/057086 | 6/2005 |
| WO | WO 2006/098795 | 9/2006 |
| WO | WO 2006/136256 | 12/2006 |
| WO | WO 2007/059051 | 5/2007 |
| WO | WO 2007/124311 | 11/2007 |
| WO | WO 2007/124438 | 11/2007 |
| WO | WO 2008/088534 | 7/2008 |
| WO | WO 2008/094247 | 8/2008 |
| WO | WO 2008/094651 | 8/2008 |
| WO | WO 2008/118402 | 10/2008 |
| WO | WO 2009/075858 | 6/2009 |

OTHER PUBLICATIONS

Dallmer Manutronic brochure, "The First Electronic mixer-taps that your hands can orchestrate," Dallmer Handel GmbH, at least as early as Jan. 31, 2008, 12 pgs.

International Search Report and Written Opinion for PCT/US2007/025336, 5 pages.

International Search Report and Written Opinion for PCT/US2008/67116, 9 pages.

KWC AG, Kitchen Faucet 802285 Installation and Service Instructions, dated Jul. 2005, 8 pgs.

Philipp, Hal, "Tough Touch Screen," applicanceDESIGN, Feb. 2006.

Quantum Research Group, "E401 User Manual," 15 pgs.

Quantum Research Group, "Gorenje Puts QSlideTM Technology into Next-Generation Kitchen Hob," Feb. 8, 2006, http://www.qprox.com/news/gorenje.php, 3 pgs.

Quantum Research Group, "Qprox™ Capacitive Touch Applications," http://www.qprox.com/background/applications.php, 8 pgs.

Quantum Research Group, "QT401 QSlide™ Touch Slider IC," 2004, 16 pgs.

Quantum Research Group, "QT411-ISSG QSlide™ Touch Slider IC," 2004-2005, 12 pgs.

Sequine et al., Cypress Perform, "Application Notes AN2292," Oct. 31, 2005, 15 pgs.

Sequine et al., Cypress Perform, "Application Notes AN2233a," Apr. 14, 2005, 6 pgs.

SLOAN® Optima® i.q. Electronic Hand Washing Faucet, Apr. 2004, 2 pgs.

Symmons, Ultra-Sense, Battery-Powered Faucets with PDS and Ultra-Sense AC Powered Faucets, © 1999-2004, 2 pgs.

Symmons, Ultra-Sense, Sensor Faucet with Position-Sensitive Detection, © 2001-2002, 2 pgs.

Symmons® Commercial Faucets: Reliability With a Sense of Style, 1 pg.

Symmons®, "Ultra-Sense® Battery-Powered, Sensor-Operated Lavatory Faucet S-6080 Series," Oct. 2002, 4 pgs.

Symmons®, "Ultra-Sense® Sensor Faucets with Position-Sensitive Detection," Aug. 2004, 4 pgs.

Technical Concepts International, Inc., Capri AutoFaucet® with Surround Sensor™ Technology, 500556, 500576, 500577, (undated), 1 pg.

Technical Concepts, AutoFaucet® with "Surround Sensor" Technology, Oct. 2005, 4 pgs.

TOTO® Products, "Self-Generating EcoPower System Sensor Faucet, Standard Spout," Specification Sheet, Nov. 2002, 2 pgs.

Various Products (available at least before Apr. 20, 2006), 5 pgs.

Villeroy & Boch "Magic Faucet," 2 pgs.

Villeroy & Boch web pages, "Magic Basin," 2 pgs., downloaded from http://www.villeroy-boch.com on Dec. 27, 2006.

ZURN® Plumbing Products Group, "AquaSense® Sensor Faucet," Jun. 9, 2004, 2 pgs.

ZURN® Plumbing Products Group, "AquaSense® Z6903 Series", Installation, Operation, Maintenance and Parts Manual, Aug. 2001, 5 pgs.

Heo WaterDesign, "Touch Faucets—Amazing Futuristic Faucet Designs,." Oct. 6, 2009, 3 pgs.

International Search Report and Written Opinion for PCT/US2008/13598, 13 pgs.

Hego WaterDesign, "Touch Faucets—Amazing Futuristic Faucet Designs," Oct. 6, 2009, 3 pgs.

* cited by examiner

CAPACITIVE COUPLING ARRANGEMENT FOR A FAUCET

CROSS REFERENCE TO RELATED APPLICATIONS

This application is a continuation of U.S. application Ser. No. 12/600,769 filed on Nov. 18, 2009, now U.S. Pat. No. 8,613,419, which is a U.S. National Phase Application of PCT International Application No. PCT/US2008/013598, filed on Dec. 11, 2008, which claims the benefit of U.S. application Ser. No. 61/007,165, filed on Dec. 11, 2007, all of which are expressly incorporated by reference herein.

BACKGROUND AND SUMMARY

The present invention relates to improvements in capacitive sensors for activation of faucets. More particularly, the present invention relates to the placement of a capacitive touch sensors in or adjacent to faucet spouts and faucet handles to sense touches by a user of the faucet and then control the faucet based on output signals from the capacitive sensor.

An illustrated embodiment, a faucet includes a touch sensor in a spout of the faucet, and another touch sensor in a manual valve handle. The touch sensor in the spout permits a user to turn water flow on and off merely by tapping the spout. In the illustrated embodiment, the faucet distinguishes between a tap on the spout to turn the water flow on or off, and a longer grasping or grab of the spout, for example, to swing it from one basin of a sink to another. The faucet therefore provides an easy and convenient way to turn the water off and on without having to adjust the water flow rate and temperature.

The touch sensor in the handle can also be used for a tap control, which distinguishes between grasping or grab of the handle to adjust the water flow rate or temperature, and merely tapping the handle to toggle water flow off or on. The touch sensor in the handle provides an additional source of input data for the faucet which permits the faucet to more accurately determine the intent of the user, thereby providing greater water savings while being intuitive and easy to use.

According to an illustrated embodiment of the present disclosure, a faucet comprises a spout, a passageway that conducts fluid flow through the spout, a electrically operable valve located within the passageway, a manual valve located within the passageway in series with the electrically operable valve, and a manual handle that controls the manual valve. The faucet also comprises a first touch sensor on the manual valve handle, a second touch sensor on the spout, a capacitive sensor directly coupled to one of the first and second touch sensors and capacitively coupled to the other of the first and second touch sensors, and a controller coupled to the capacitive sensor. The capacitive sensor provides an output signal. The controller is configured to monitor the output signal from the capacitive sensor and to distinguish between a user tapping one of the spout and the manual valve handle, a user grabbing the spout, and a user grabbing the manual valve handle. The controller is also coupled to the electrically operable valve to control the electrically operable valve is response to the output signal from the capacitive sensor.

According to another illustrated embodiment of the present disclosure, a method is provided for controlling fluid flow in a faucet having a spout, a passageway that conducts fluid flow through the spout, a electrically operable valve located within the passageway, a manual valve located within the passageway in series with the electrically operable valve, and a manual handle that controls the manual valve. The method comprises providing a first touch sensor on the manual valve handle, providing a second touch sensor on the spout, providing a capacitive sensor, directly coupling one of the first and second touch sensors to the capacitive sensor, capacitively coupling the other of the first and second touch sensors to the same capacitive sensor, monitoring an output signal from the capacitive sensor to detect touches of both the first and second touch sensors by a user, and controlling the electrically operable valve is response to the monitoring step.

Additional features and advantages of the present invention will become apparent to those skilled in the art upon consideration of the following detailed description of illustrative embodiments exemplifying the best mode of carrying out the invention as presently perceived.

BRIEF DESCRIPTION OF THE DRAWINGS

The detailed description of the drawings particularly refers to the accompanying figures in which.

DETAILED DESCRIPTION OF THE DRAWINGS

For the purposes of promoting an understanding of the principles of the invention, reference will now be made to certain illustrated embodiments and specific language will be used to describe the same. It will nevertheless be understood that no limitation of the scope of the invention is thereby intended. Such alterations and further modifications of the invention, and such further applications of the principles of the invention as described herein as would normally occur to one skilled in the art to which the invention pertains, are contemplated and desired to be protected.

Figure 1:
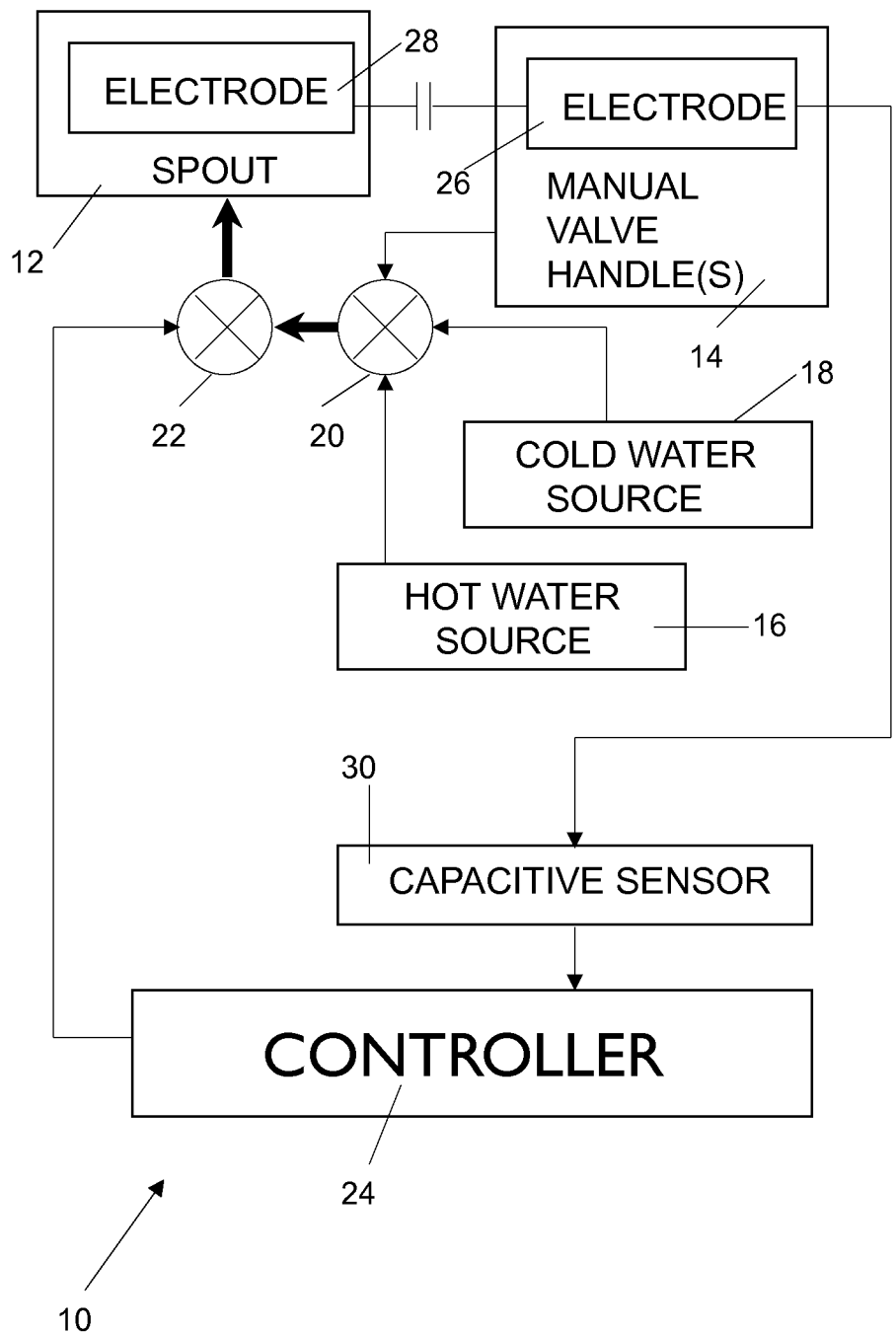
FIG. 1 is a block diagram of a fluid delivery assembly including a capacitive sensor system.

FIG. 1 is a block diagram illustrating one embodiment of a sensing faucet system 10 of the present invention. The system 10 includes a spout 12 for delivering fluid such as water into a sink basin, for example, and at least one manual valve handle 14 for controlling the flow of water through the spout 12 in a manual mode. A hot water source 16 and cold water source 18 are illustratively coupled to a manual valve body assembly 20. In one illustrated embodiment, separate manual valve handles 14 are provided for the hot and cold water sources 16, 18. In another illustrated embodiment, such as for a kitchen application, a single manual valve handle 14 is used for both hot and cold water delivery. In such kitchen embodiment, the manual valve handle 14 and spout 12 are typically coupled to the basin through a single hole mount. An output of valve body assembly 20 is coupled to an actuator driven valve 22 which is controlled electronically by input signals from a controller 24. Valves 20 and 22 are illustratively located in a passageway that conducts fluid flow through the spout 12. In an illustrative embodiment, actuator driven valve 22 may be a magnetically latching pilot-controlled solenoid valve.

In an alternative embodiment, the hot water source 16 and cold water source 18 may be connected directly to actuator driven valve 22 to provide a fully automatic faucet without any manual controls. In yet another embodiment, the controller 24 controls an electronic proportioning valve (not shown) to supply water for the spout 12 from hot and cold water sources 16, 18.

Because the actuator driven valve 22 is controlled electronically by controller 24, flow of water can be controlled using outputs from a capacitive sensor 30 as discussed herein. As shown in FIG. 1, when the actuator driven valve 22 is open, the faucet system may be operated in a manual control mode through operation of the handle(s) 14 and the manual valve member of valve body assembly 20. Conversely, when the manually controlled valve body assembly 20 is set to select a water temperature and flow rate, the actuator driven valve 22 can be touch controlled when a user's hands touch a sensor to toggle water flow on and off as discussed below.

A first touch sensor electrode 26 is electrically coupled to the manual valve handle(s) 14. Spout 12 illustratively has a second touch sensor electrode 28 capacitively coupled to the first electrode 26. The spout 12 is illustratively made from a conductive material to form the second touch sensor electrode 28. Alternatively, a separate electrode 28 may be coupled to the spout 12.

First electrode 26 is directly coupled to the capacitive sensor 30 of controller 24. In the embodiment of FIG. 1, a wire is used to connect the first electrode 26 to the capacitive sensor 30. It is understood that any conventional capacitive sensor 30 may be used in accordance with the present invention. See, for example, U.S. Pat. No. 6,962,168 which is incorporated herein by reference. Since the spout 12 is often movable, it is not desirable to have a wire connection to the electrode 28 of spout 12. Therefore, the electrode 28 of spout 12 is capacitively coupled to the electrode 26 as discussed in more detail below. It is understood that in another embodiment, the second electrode 28 on the spout 12 may be directly coupled to the capacitive sensor 30 and the first electrode 26 on the handle 14 may be capacitively coupled to the first electrode 28.

Figure 2:
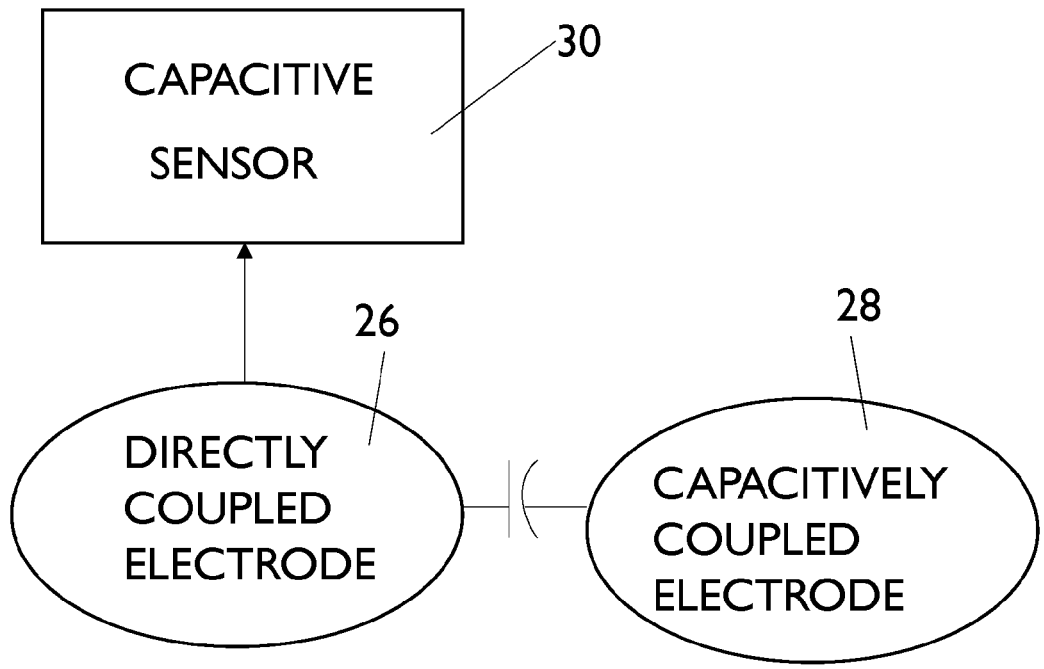
FIG. 2 is an example of a dual-electrode, capacitively coupled sensing system with a single capacitive sensor.

FIG. 2 is an example of a dual electrode, capacitively coupled sensing arrangement using a single capacitive sensor 30. Although the embodiment of FIG. 2 is specifically disclosed herein for use with a fluid delivery apparatus such as a faucet, it is understood that the sensing and control techniques used herein may have other applications.

Figure 3:
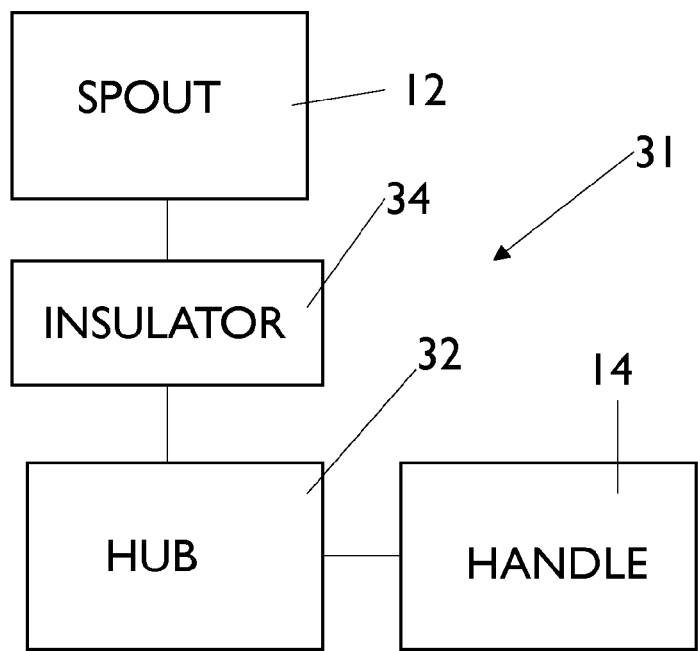
FIG. 3 is a block diagram illustrating a spout of a fluid delivery assembly capacitively coupled to a faucet body hub by an insulator.

FIG. 3 illustrates additional details of a single hole mount faucet 31. A faucet body hub 32 is electrically coupled to the manual valve handle 14, for example, by metal-to-metal contact between the handle 14 and the hub 32. Manual valve handle 14 is movably coupled to the faucet body hub 32 in a conventional manner to control water flow and temperature through valve 20. Since the manual valve handle 14 and the faucet body hub 32 are electrically connected, the first electrode 26 may be coupled to either the manual valve handle 14 or the hub 32, as desired.

The spout 12 is coupled to faucet body hub 32 by an insulator 34. In one embodiment, such as for a kitchen faucet, the spout 12 is rotatable relative to the faucet body hub 32. In other embodiments, the spout 12 may be fixed relative to the faucet body hub 32. Spout 12 may include a pull-out or pull-down spray head which is electrically isolated from the spout 12.

As discussed above, the manual valve handle 14 is electrically connected to the faucet body hub 32. The spout 12 is capacitively coupled to the body hub by insulator 34. When the manual valve handle 14 is touched by a user's hand, the capacitance to earth ground is directly coupled. The capacitive sensor 30 of controller 24 therefore detects a larger capacitance difference when the handle 14 is touched by a user compared to when the spout 12 is touched. This results in a larger amplitude output signal when the manual valve handle 14 is touched by a user's hand compared to when the spout 12 is touched. By comparing the amplitude of the output signal to predetermined threshold values, the controller 24 can detect where the faucet is touched and how long the faucet is touched to enable the controller 24 to make water activation decisions as discussed below.

The following is a description of algorithms used to process "touch" conditions of two electrodes 26, 28 which are capacitively coupled to one another using a single capacitive sensor 30 which detects changes in electrical capacitance. The interpretation of how and when the electrodes 26, 28 are touched is used to determine when to actuate an electronic valve 22.

It should be appreciated that the method and apparatus detailed herein may be used in connection with the faucet disclosed in PCT International Patent Application Publication No. WO 2008/088534 entitled "MULTI-MODE HANDS FREE AUTOMATIC FAUCET", filed Dec. 11, 2007, and U.S. patent application Ser. No. 11/641,574, filed Dec. 29, 2006, and published as U.S. Publication No. 2007/0157978, the disclosures of which are expressly incorporated by reference herein.

A first embodiment of a detection algorithm for distinguishing between short taps and longer grabs of the spout 12 or handle 14, for example, will be described first. The following definitions are used in the first example of the detection algorithm. A "tap" is a touch of short duration designed to turn the water or fluid on or off. A "grab" has a longer duration such as when a user grasps the spout 12 to move the spout from one area of the sink basin to another or when the user grasps the manual valve handle 14 to adjust the flow rate or temperature of the fluid. The following definitions apply to the first embodiment. Taps and grabs are determined differently in the second embodiment discussed below.

Slew Rate: The maximum rate of change of an output signal, expressed in units/second. (Example: counts/second, volts/second, LSbs/second)

Direct Coupling: the connection of an electrode that is resistively coupled, or connected, to the input of a sensor.

Capacitive Coupling: an electrode's connection to the input of a sensor which is capacitive in nature due to a physical separation by some material with a defined dielectric constant. There is no resistive element in the connection in this type of configuration.

Tap: an event which occurs when a sensor's output signal crosses above the absolute value of a pre-defined threshold for some period, $t_R$, and the following condition is met: $T_{TAP\_MIN} \leq t_R < T_{TAP\_MAX}$.

Grab: An event which occurs any time a sensor's output signal crosses above the absolute value of a pre-defined threshold for at least $T_{TAP\_MAX}$.

Touch: An event which is defined as any time a sensor's output signal crosses above the absolute value of a pre-defined threshold for at least $T_{TAP\_MIN}$.

Release: An event which is defined as any time a sensor's output signal crosses below the absolute value of a pre-defined threshold.

$T_{TAP\_MIN}$: A defined, minimum, amount of time which a sensor's output signal must cross above the absolute value of a pre-defined threshold to qualify as a tap condition.

$T_{TAP\_MAX}$: A defined, maximum, amount of time which a sensor's output signal must crosses above the absolute value of a pre-defined threshold to qualify as a tap condition. The signal must have dropped below the threshold prior to this time to still qualify as a tap condition. If the signal is still above the threshold beyond this period of time, a grab condition has occurred.

Figure 4:
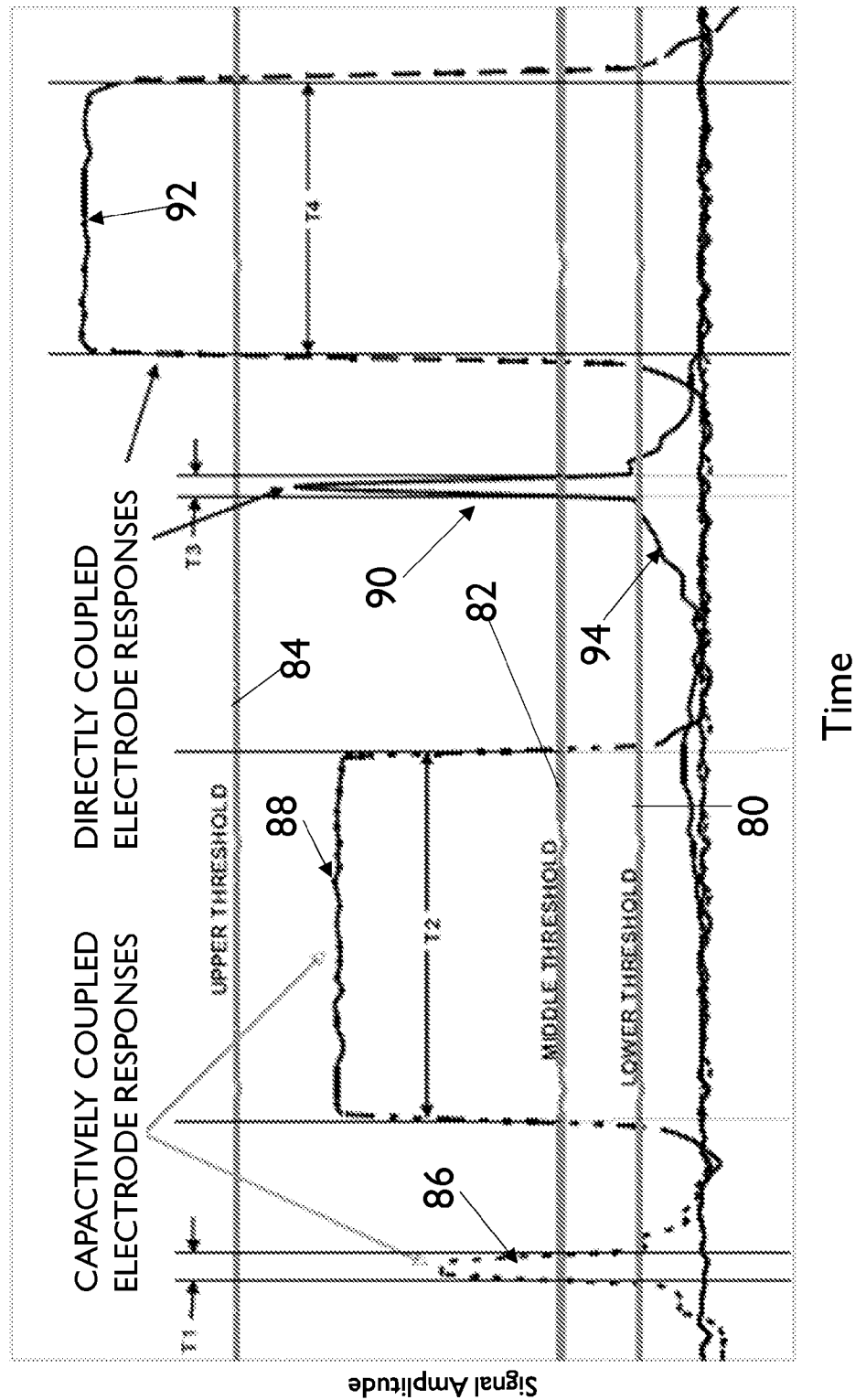
FIG. 4 illustrates a signal amplitude output in response to short taps and longer grabs on the first and second electrodes of FIGS. 1 and 2.

FIG. 4 illustrates a typical output response signal of a dual electrode 26, 28, capacitively coupled sensing arrangement using a single capacitive sensor 30 as discussed above. The distinction between human touches on each electrode 26, 28 can be seen in FIG. 4. Possible algorithm threshold settings are shown on the graph of FIG. 4. For example, FIG. 4 illustrates a lower threshold amplitude at line 80, a middle threshold amplitude at line 82, and an upper threshold amplitude illustrated at line 84.

Due to the slew rate of a chosen sensor connected to a particular electrode, it will take some minimum amount of time for the output signal to reach its maximum amplitude and achieve some steady state level. This is shown in FIG. 4 in which the directly coupled first electrode 26 is tapped at location 90, and the maximum output level of the sensor is less than the maximum output level achievable if the first electrode 26 is grabbed for a minimum amount of time to allow a steady state level to be reached as illustrated at location 92. The slew rate for a directly coupled electrode 26 and a capacitively coupled electrode 28 may differ. The maximum achievable amplitude of a capacitively coupled electrode 28 is less than the maximum achievable amplitude of a directly coupled electrode 26. For example, location 86 of FIG. 4 illustrates the amplitude of the signal when capacitively coupled electrode 28 is tapped and location 88 illustrates the maximum achievable amplitude of the capacitively coupled electrode 28 when the electrode 28 is grabbed to allow a steady state level to be reached. The maximum steady state level achievable by a given sensor in a given system may vary depending on the following conditions:

1. What, or who, is touching the sensor,
2. The particular type of capacitive sensing technology employed by the system,
3. The amount of capacitance between the two electrodes and the associated dielectric constant of the material of separation,
4. Any conductive materials in the near vicinity of the electrodes which may add to the total capacitance being sensed.

In a system using two separate sensors for the two electrodes with isolation between the electrodes, distinguishing between taps, grabs, and releases of the two electrodes is a fairly straight forward task. However, due to the behavior of a system using capacitively coupled electrodes 26, 28 and a single capacitive sensor 30 as shown in FIGS. 1 and 2, the manner in which detections are made differs. Tables 1 through 3 show the possible detection states that can be accurately determined using the different sensing configurations.

As shown in Table 1, a dual sensor, dual electrode configuration can accurately distinguish up to 16 different states. A drawback is that the control algorithms must also process and determine what state is currently present. Table 2 shows what states are possible to determine using a single sensor, dual electrode configuration with capacitively coupled electrodes as shown in FIGS. 1 and 2, for example.

TABLE 1

| STATE | Electrode 1 | | | Electrode 2 | | |
|---|---|---|---|---|---|---|
| | TOUCHED | TAPPED | GRABBED | TOUCHED | TAPPED | GRABBED |
| 1 | 0 | 0 | 0 | 0 | 0 | 0 |
| 2 | 0 | 0 | 0 | 0 | 1 | 0 |
| 3 | 0 | 0 | 0 | 1 | 0 | 0 |
| 4 | 0 | 0 | 0 | 1 | 0 | 1 |
| 5 | 0 | 1 | 0 | 0 | 0 | 0 |
| 6 | 0 | 1 | 0 | 0 | 1 | 0 |
| 7 | 0 | 1 | 0 | 1 | 0 | 0 |
| 8 | 0 | 1 | 0 | 1 | 0 | 1 |
| 9 | 1 | 0 | 0 | 0 | 0 | 0 |
| 10 | 1 | 0 | 0 | 0 | 1 | 0 |
| 11 | 1 | 0 | 0 | 1 | 0 | 0 |
| 12 | 1 | 0 | 0 | 1 | 0 | 1 |
| 13 | 1 | 0 | 1 | 0 | 0 | 0 |
| 14 | 1 | 0 | 1 | 0 | 1 | 0 |
| 15 | 1 | 0 | 1 | 1 | 0 | 0 |
| 16 | 1 | 0 | 1 | 1 | 0 | 1 |

Detectable states using a dual sensor, dual electrode sensing configuration

TABLE 2

| Electrode 1 (Direct) | | | Electrode 2 (Capacitive) | | | |
|---|---|---|---|---|---|---|
| TOUCHED | TAPPED | GRABBED | TOUCHED | TAPPED | GRABBED | STATE |
| 0 | 0 | 0 | 0 | 0 | 0 | 1 |
| 0 | 0 | 0 | 0 | 1 | 0 | 2 |
| 0 | 0 | 0 | 1 | 0 | 0 | 3 |
| 0 | 0 | 0 | 1 | 0 | 1 | 4 |
| 0 | 1 | 0 | 0 | 0 | 0 | 5 |

TABLE 2-continued

| Electrode 1 (Direct) | | | Electrode 2 (Capacitive) | | | |
|---|---|---|---|---|---|---|
| TOUCHED | TAPPED | GRABBED | TOUCHED | TAPPED | GRABBED | STATE |
| 1 | 0 | 0 | 0 | 0 | 0 | 6 |
| 1 | 0 | 1 | 0 | 0 | 0 | 7 |

Detectable states using a single sensor configuration with capacitively coupled electrodes

TABLE 3

| E1 TOUCH | E2 TOUCH | TAPPED | GRABBED | STATE |
|---|---|---|---|---|
| 0 | 0 | 0 | 0 | 1 |
| 0 | 0 | 1 | 0 | 2 |
| 0 | 1 | 0 | 0 | 3 |
| 0 | 1 | 0 | 1 | 4 |
| 1 | 0 | 0 | 0 | 5 |
| 1 | 0 | 0 | 1 | 6 |

Shown is a further reduction of states in Table 2 by eliminating the need to detect a tap of electrode 1 and electrode 2 separately.

For the example shown in Table 1, thresholds for each sensor/electrode can be determined such that at any time the sensor's signal crosses said threshold, the electrode is defined as having been touched. If the signal crosses the threshold for a defined period of time, as defined in the Definitions section above, flags can be set as to whether the electrode has been tapped or grabbed. The exact states that appear for one electrode in this example can appear for the second electrode at the same time. In this configuration, each sensor can have its own set of thresholds for determining when the sensor has been touched and released. The setting of those thresholds can be determined using a "dynamic baseline" determined from the raw sensor signal. A dynamic baseline is a calculated level based on the raw output level of the sensor. In this way, the "baseline" will tend to track the raw signal in the manner defined by the calculation of the baseline. Having independent thresholds is not possible for the case of a single sensor application using capacitively coupled electrodes.

Table 2 describes the detectable states that can be determined in the application shown in FIGS. 1 and 2. FIG. 4 illustrates that if electrode 28 is touched for a long enough time to reach steady state amplitude, that the maximum achievable level at location 88 is not as great as the maximum achievable amplitude of electrode 26 which is directly coupled to the capacitive sensor 30 as illustrated at location 92. If the Upper Threshold 84 shown in FIG. 4 is adjusted such that it is above the maximum amplitude of electrode 28, but below the maximum amplitude of electrode 26, a determination can be made between the two. However, due to the rise times associated with each electrode's slew rate, a tap event on the first electrode 26 may never cross the Upper Threshold 84 as illustrated at location 90 and cannot be reliably distinguished between a tap of electrode 28 and a tap of electrode 26. For this reason, the algorithm may be designed using a reduced subset of states shown in Table 2 as reflected in Table 3.

An example for this type of sensing is in the control of the electronic valve 22 for a plumbing application. The algorithm in question will do the following:

1. If the first electrode 26 (directly coupled electrode) is touched and the Electronic Valve 22 (from here on referred to as the EV,) is closed, the request will be made to open the EV 22.
2. If either electrode 26, 28 is tapped while the EV 22 is open, a request will be made to close the EV 22.
3. If first electrode 26 is grabbed and the EV 22 is open, no action will be taken on the EV 22.
4. If second electrode 28 is grabbed and the EV 22 is open, no action will be taken on the EV 22.
5. If second electrode 28 is grabbed and the EV 22 is closed, no action will be taken on the EV 22.
6. If either electrode 26, 28 is tapped while the EV 22 is closed, a request will be made to open the EV 22.

Instead of trying to determine the difference between two electrodes 26, 28, rather, we concentrate on determining whether the sensor's signal has crossed one of three dynamic thresholds 80, 82, 84 as shown in FIG. 4. Therefore, one more step in the algorithm needed for detecting the states of Table 2 may be saved to go from 7 possible states to 6. The algorithm will then obey the following rules: (Sensor's Signal=SIG, UT=Upper Threshold, MT=Middle Threshold and LT=Lower Threshold.)

1. If $|SIG|>|UT|$ for a period $t_R$, and $t_R \geq T_{TAP\_MIN}$, and the EV is closed, a request will be made to open the EV. This is reflected by states 5 and 6 of Table 3.

2. $|SIG|>|MT|$ for a period $t_R$, has been released, and $T_{TAP\_MIN} \leq t_R < T_{TAP\_MAX}$, a request will be made to close the EV if it was previously open, or open the EV if it was previously closed. This is reflected by state 2 of Table 3.

3. $|SIG|>|MT|$ for a period $t_R$, the EV is open, and $t_R \geq T_{TAP\_MAX}$, no action is taken.

This is reflected by states 4 and 5 of Table 3.

4. $|SIG|<|MT|$, no action is taken, regardless of the state of the EV.

State Tables

TABLE 4

| Timer State | Timer Enabled | $t_R$ |
|---|---|---|
| 0 | 1 | $t_R < t_{MIN}$ |
| 1 | 1 | $t_{MIN} \leq t_R < t_{MAX}$ |
| 2 | 1 | $t_{MAX} \leq t_R$ |
| 3 | 0 | $t_R = 0$ |

TABLE 5

| EV State | EV |
|---|---|
| 0 | Closed |
| 1 | Open |

TABLE 6

| |SIG| State | Signal Active | |SIG| |
|---|---|---|
| 0 | 1 | $|SIG| \leq |MT|$ |
| 1 | 1 | $|MT| < |SIG| \leq |UT|$ |
| 2 | 1 | $|UT| < |SIG|$ |
| 3 | 0 | $|SIG| \leq |MT|$ |

TABLE 6-continued

| |SIG| State | Signal Active | |SIG| |
|---|---|---|
| 4 | 0 | |MT| < |SIG| ≤ |UT| |
| 5 | 0 | |UT| < |SIG| |

TABLE 7

| EV State | |SIG| State | Timer State | Action |
|---|---|---|---|
| 0 | 0 | 0 | 0 |
| | | 1 | 1 |
| | | 2 | 2 |
| | | 3 | 0 |
| | 1 | 0 | 0 |
| | | 1 | 0 |
| | | 2 | 3 |
| | | 3 | 4 |
| | 2 | 0 | 0 |
| | | 1 | 5 |
| | | 2 | 5 |
| | | 3 | 4 |
| | 3 | NA | 7 |
| | 4 | NA | 0 |
| | 5 | NA | 0 |
| 1 | 0 | 0 | 0 |
| | | 1 | 6 |
| | | 2 | 2 |
| | | 3 | 0 |
| | 1 | 0 | 0 |
| | | 1 | 0 |
| | | 2 | 3 |
| | | 3 | 4 |
| | 2 | 0 | 0 |
| | | 1 | 0 |
| | | 2 | 3 |
| | | 3 | 4 |
| | 3 | NA | 7 |
| | 4 | NA | 0 |
| | 5 | NA | 0 |

TABLE 8

| Action | Description |
|---|---|
| 0 | No Action |
| 1 | OPEN EV, Disable Timer, $t_R = 0$ |
| 2 | Disable Timer, $t_R = 0$ |
| 3 | Signal = Inactive, Disable Timer, $t_R = 0$ |
| 4 | Enable Timer |
| 5 | OPEN EV, Disable Timer, $t_R = 0$, Signal = Inactive |
| 6 | CLOSE EV, Disable Timer, $t_R = 0$ |
| 7 | Signal = Active |

Process Flow

1. The states in Table 4 are defined based on the current value of $t_R$ and whether or not the timer is enabled.
2. The EV State, as shown in Table 5 is defined when a change of the EV state is made.
3. The |SIG| State in Table 6 is adjusted based on the current value of the sensor signal in relation to the defined threshold levels, MT and UT. States 0 through 2 are for when the signal is defined as being "active," and states 3 through 5 are for when the signal is defined as being "inactive."
4. Table 8 is a listing of possible actions to be taken based on the conditions shown in Table 7.
5. Table 7 shows the various actions to be taken depending on the states of the EV, |SIG| State, and Timer State.

Figure 5:
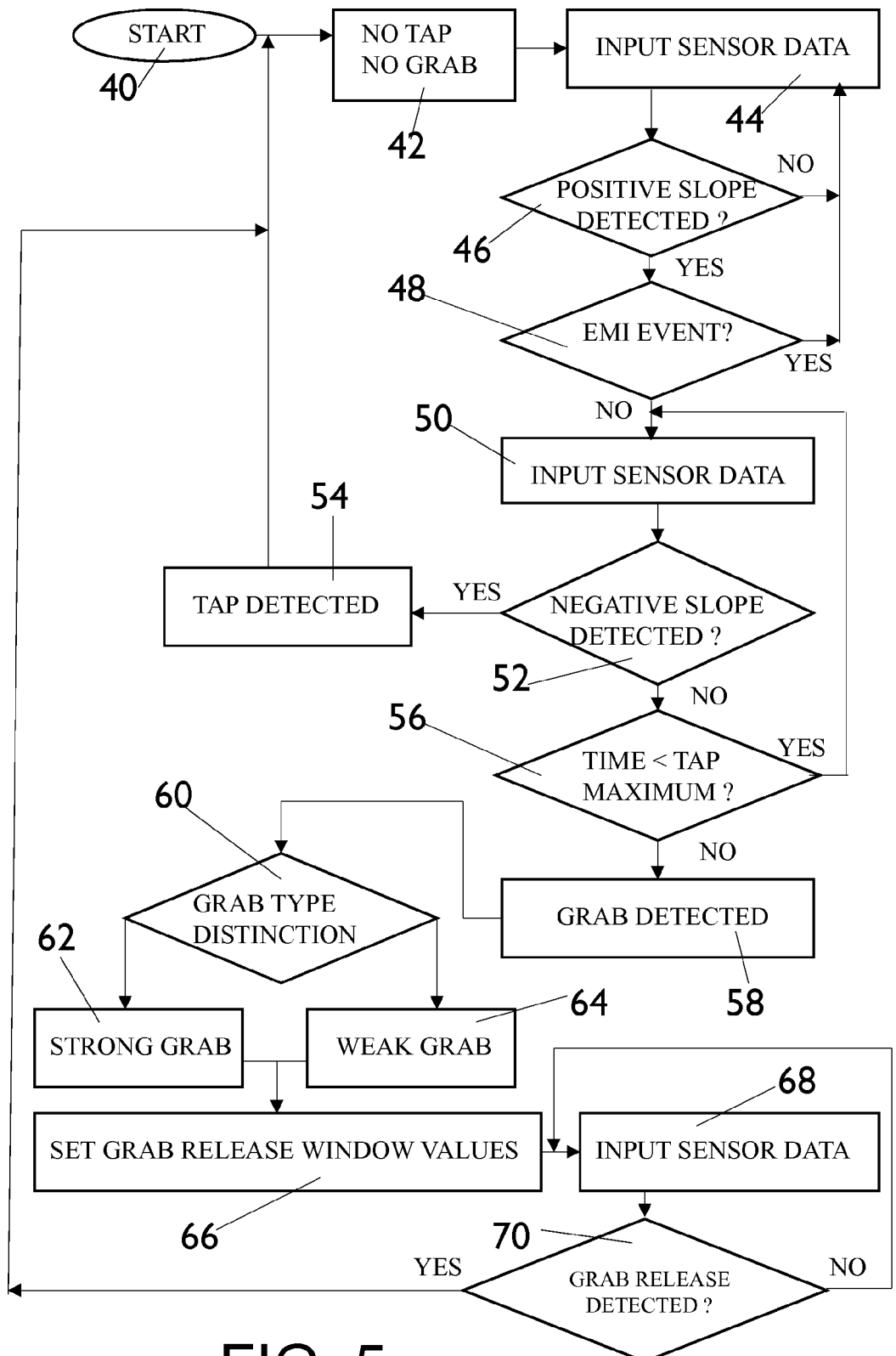
FIG. 5 is a flow chart illustrating steps performed by a controller to distinguish between short taps and longer grabs on the first and second electrodes of a capacitive sensor system of FIGS. 1 and 2.

In another illustrated embodiment of the present invention, an algorithm is provided which detects a tap by a user on either the first or second electrodes 26, 28 based upon a change in a slope detected at a leading edge of the output signal from the capacitive sensor 30. FIG. 5 is a flow chart illustrating the steps performed by controller 24 to monitor the output of the capacitive sensor 30 and determine when the electrodes 26, 28 are tapped or grabbed for controlling the fluid flow.

The process starts at block 40. Initially no tabs or grabs are detected as illustrated at block 42. Controller 24 inputs sensor data from the capacitive sensor 30 as illustrated at block 44. Controller 24 then determines whether a positive slope of the output signal is detected at block 46. Leading edges of each of the touches at locations 86, 88, 90 and 92 in FIG. 4, for example, are detected as a positive slope occurrences. The detected slope must be large enough to distinguish it from a gradual amplitude increase, such as when a user's hands approach the faucet, as illustrated at location 94 in FIG. 4, for example. In an illustrated embodiment, the slope must increase for about 10 counts in order for a positive slope to be detected at block 46.

If a positive slope is not detected at block 46, controller 24 returns to block 44 to input additional sensor data. If a positive slope is detected at block 46, controller 24 determines whether or not the positive slope is caused by an electromagnetic interference (EMI) event at block 48. For example, electromagnetic interference may occur if someone starts a dishwasher or other appliance near the faucet. Controller 24 may test for an EMI event by confirming that the positive slope still exists at a later time interval such as, for example, 10 ms after the positive slope is initially detected. If the signal is still has a positive slope after 10 ms, controller 24 determines that the positive slope is caused by a touch of electrodes 26 or 28 and not by an EMI event.

If an EMI event is detected at block 48, controller 24 returns to block 44 to input additional sensor data. If an EMI event is not detected at block 48, controller 24 inputs additional sensor data at block 50. Controller 24 then determines whether a negative slope of the output signal is detected at block 52. Negative slopes of the output signal are illustrated, for example, at the trailing edges of portions 86, 88, 90 and 92 of the output signal of FIG. 4. If a negative slope is detected at block 52, controller 24 determines that a "tap" has been detected as illustrated at block 54. Controller 24 will then control the electronic valve 22 as discussed below in response to the tap. Controller 24 then returns back to the start block 40 to monitor for the next touch of electrodes 26, 28.

If a negative slope is not detected at block 52, controller 24 determines whether an elapsed time since the positive slope was detected at block 46 is less than a maximum elapsed time permitted for a tap event as illustrated at block 56. Illustratively, the maximum elapsed time for a tap event is about 300 ms. If the elapsed time is less than the maximum time for a tap event, controller 24 returns to block 50 to input additional sensor data. If the elapsed time at block 56 exceeds the maximum time permitted for a tap event at block 56, controller 24 detects a "grab" as illustrated at block 58. Next, controller 24 determines a type of grab that has occurred as illustrated at block 60. In the illustrated example, controller 24 distinguishes between a "strong" grab at block 62 and a "weak" grab at block 64. A strong grab at block 62 occurs when the user grabs the manual valve handle 14 used to adjust the flow or temperature of the fluid. A weak grab at block 64 occurs when the user grabs the spout 12. Controller 24 will then control the electronic valve 22 as discussed below in response to the detected strong or weak grab.

Once a determination is made between a strong grab and a weak grab, controller 24 sets a timer for grab release window values as illustrated at block 66. Controller 24 then inputs additional sensor data as illustrated at block 68. Next, controller 24 determines whether a grab release is detected within the release window at block 70. If not, controller 24 continues to input sensor data at block 68. If the grab release is detected at block 70, controller 24 returns back to start block 40 to monitor for the next touch of electrodes 26, 28. A grab release is detected by a negative slope of the output signal indicating that the user has released the electrode 26, 28.

In the embodiment of FIG. 5, the output from the capacitive sensor 30 does not have to reach a lower threshold level such as level 80 in FIG. 4 in order to be considered a tap event. Therefore, the embodiment of FIG. 5 provides improved detection of taps of the electrodes 26, 28. When the electrodes 26, 28 are grabbed for a longer period of time, the steady state amplitudes are reached at, for example, locations 88 and 92 of FIG. 4. These steady state levels are more easily predicted than the shorter duration taps as discussed above. In the embodiment of FIG. 5, the upper threshold level 84 is set to distinguished between strong grabs of the first electrode 26 on the handle 14 and weak grabs of the second electrode 28 on the spout 12. Once a grab is detected, if the amplitude of the steady state signal at location 88 is detected, it is determined that a grab of the spout 12 has occurred since the amplitude is below the upper threshold 84. If the output signal is above the upper threshold 84 during a grab as indicated at location 92, a strong grab of the handle 14 is detected.

The maximum amplitudes of the steady state signals when the first and second electrodes 26, 28 are grabbed at locations 92 and 88, respectively, of FIG. 4 may be adjusted. For example, the hub 32 may include a metallic portion which extends into the insulator 34. The metallic portion of the hub 32 overlaps a portion of the metal spout 12. The amount of overlap of metal between the hub 32 and the spout 12 effects the signal amplitude of the output signal of capacitively coupled electrode 26. Therefore, by reducing the metallic overlap between the hub 32 and the spout 12, the signal amplitude 88 in response to touches of the second electrode 28 coupled to the spout 12 may be reduced. Increasing the signal amplitude difference between the maximum signal output of the first and second electrodes 26, 28, facilitates distinguishing between strong grabs of the manual valve handle 14 and weak grabs of the spout 12.

Figure 6:
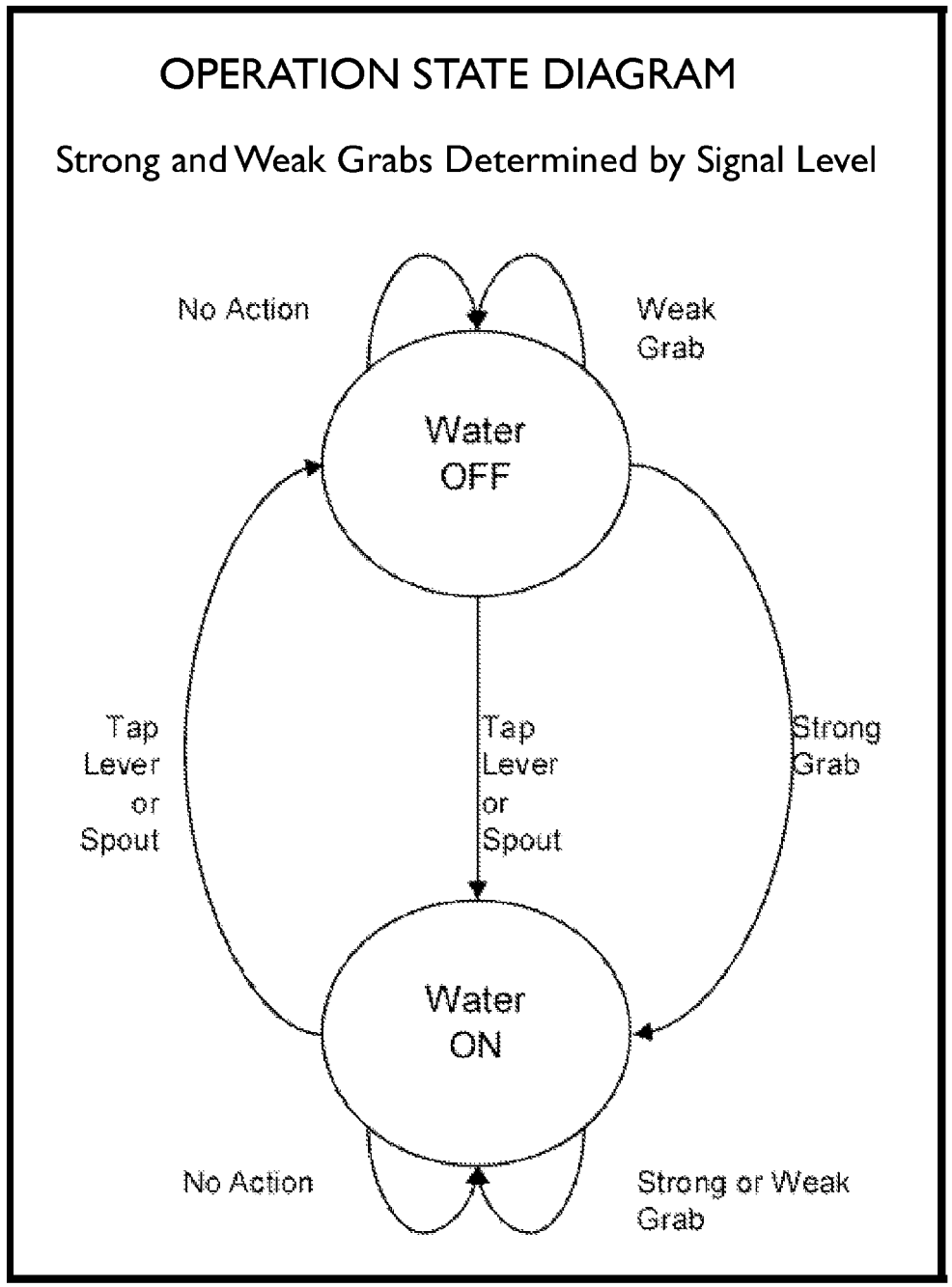
FIG. 6 is an operation state diagram illustrating control of fluid flow based on an output of the capacitive sensor.

FIG. 6 is an operation state diagram for the second embodiment of the present invention. If the water is off, a tap of either the handle lever 14 or spout 12 will cause the water to turn on. A strong grab indicating that the handle 14 is grabbed will also turn the water on. However, when the water is off, a weak grab of the spout 12 will not turn on the water. When the water is on, a tap of the lever handle 14 or spout 12 will turn the water off However, when the water is on, strong and weak grabs of the handle 14 and spout 12 respectively, will not cause the water to turn off. Therefore, when the water is on, the user can adjust the location of the spout or grab the handle 14 and adjust the temperature or flow rate of the water without shutting the water off.

While the invention has been illustrated and described in detail in the drawings and foregoing description, the description is to be considered as illustrative and not restrictive in character. Only illustrated embodiments, and such alternative embodiments deemed helpful in further illuminating the illustrated embodiments, have been shown and described. It will be appreciated that changes and modifications to the forgoing can be made without departing from the scope of the following claims.

The invention claimed is:

1. A faucet comprising:
a spout;
a passageway that conducts fluid flow through the spout;
an electrically operable valve located within the passageway;
a manual valve located within the passageway in series with the electrically operable valve;
a manual handle that controls the manual valve;
an insulator located between the spout and the manual handle so that the spout is electrically isolated from the manual handle;
a first touch sensor on the manual valve handle;
a second touch sensor on the spout;
a capacitive sensor directly coupled to one of the first and second touch sensors and capacitively coupled to the other of the first and second touch sensors without a direct electrical connection through a conductor to the capacitive sensor, the capacitive sensor providing an output signal; and
a controller coupled to the capacitive sensor, the controller being configured to monitor the output signal from the capacitive sensor to detect touching of the spout and the manual valve handle, the controller also being coupled to the electrically operable valve to control the electrically operable valve in response to the output signal from the capacitive sensor.

2. The faucet of claim 1, wherein the controller toggles the electrically operable valve between open and closed positions in response to detecting a user tapping one of the spout and the manual valve handle.

3. The faucet of claim 1, wherein the controller toggles the electrically operable valve when either of the first and second touch sensors are touched and released within a period of time shorter than a predetermined time.

4. The faucet of claim 1, wherein the electrically operable valve is a magnetically latching valve.

5. The faucet of claim 1, wherein the controller determines that a user has tapped one of the spout and the manual valve handle when both a positive slope of the output signal and a negative slope of the output signal are detected within a predetermined period of time.

6. The faucet of claim 5, wherein the controller further determines whether an electromagnetic event caused the positive slope of the output signal instead of a tap by the user on the spout or the manual valve handle.

7. The faucet of claim 5, wherein the controller further determines that a user has grabbed one of the spout and the manual valve handle when the length of time between the positive slope of the output signal and the negative slope of the output signal is greater than the predetermined time.

8. The faucet of claim 7, wherein, if the controller determines that one of the spout and manual valve handle was grabbed by a user, the controller further determines which one of the spout and manual valve handle was grabbed by a user based upon an amplitude of the output signal between the detected positive and negative slopes.

9. The faucet of claim 8, wherein the controller determines that the manual valve handle was grabbed by a user if the amplitude of output signal between the detected positive and negative slopes is greater than a predetermined threshold value.

10. The faucet of claim 9, wherein the controller determines that the spout was grabbed by a user if the amplitude of the output signal between the detected positive and negative slopes is less than the predetermined threshold value.

11. The faucet of claim 1, wherein the electrically operable valve is an electronic proportioning valve and wherein the controller directs the electrically operable valve to change among open, closed, and the plurality of partially closed positions in response to a duration of contact by the user with the first and second touch controls.

12. The faucet of claim 1, further comprising a faucet body hub, the manual valve handle being movably coupled to the faucet body hub to control the manual valve, the manual valve handle being electrically coupled to the faucet body hub, and wherein the spout is coupled to the faucet body hub by the insulator so that the spout is electrically isolated from the faucet body hub.

13. The faucet of claim 12, wherein the spout is rotatably coupled to the faucet body hub.

14. The faucet of claim 1, wherein the first touch sensor includes a first electrode coupled to the manual valve handle, the first electrode being directly coupled to the capacitive sensor.

15. The faucet of claim 14, wherein the second touch sensor includes a second electrode on the spout, the second electrode being capacitively coupled to the first electrode.

16. The faucet of claim 15, wherein the spout is formed from a conductive material to provide the second electrode.

17. The faucet of claim 1, wherein the controller is configured to monitor the output signal from the capacitive sensor and to distinguish between a user tapping one of the spout and the manual valve handle, a user grabbing the spout, and a user grabbing the manual valve handle, and wherein the controller controls the electrically operable valve in response to the output signal from the capacitive sensor as follows:
  if either of the first and second touch sensors are tapped while the electrically operable valve is closed, the controller opens the electrically operable valve;
  if the first touch sensor is grabbed and the electrically operable valve is closed, the controller opens the electrically operable valve;
  if either of the first and second touch sensors are tapped while the electrically operable valve is open, the controller closes the electrically operable valve;
  if first touch sensor is grabbed and the electrically operable valve is open, no action is taken on the electrically operable valve;
  if second touch sensor is grabbed and the electrically operable valve is open, no action is taken on the electrically operable valve; and
  if second touch sensor is grabbed and the electrically operable valve is closed, no action is taken on the electrically operable valve.

18. A faucet comprising:
a spout;
a passageway that conducts fluid flow through the spout;
an electrically operable valve in fluid communication with the passageway;
a manual valve in fluid communication with the passageway in spaced relation to the electrically operable valve;
a manual handle that controls the manual valve;
an insulator located between the spout and the manual handle so that the spout is electrically isolated from the manual handle;
a first touch sensor on the manual valve handle;
a second touch sensor on the spout;
a capacitive sensor directly coupled to one of the first and second touch sensors and capacitively coupled to the other of the first and second touch sensors without a direct electrical connection through a conductor to the capacitive sensor, the capacitive sensor providing an output signal; and
a controller coupled to the capacitive sensor, the controller being configured to monitor the output signal from the capacitive sensor to detect touching of the spout and the manual valve handle, the controller also being coupled to the electrically operable valve to control the electrically operable valve in response to the output signal from the capacitive sensor.

19. The faucet of claim 18, wherein the first touch sensor includes a first electrode coupled to the manual valve handle, the first electrode being directly coupled to the capacitive sensor.

20. The faucet of claim 19, wherein the second touch sensor includes a second electrode on the spout, the second electrode being capacitively coupled to the first electrode.

21. The faucet of claim 20, wherein the spout is formed from a conductive material to provide the second electrode.

* * * * *